(12) United States Patent
Daniel et al.

(10) Patent No.: US 11,230,986 B2
(45) Date of Patent: Jan. 25, 2022

(54) METHOD TO DETERMINE THE OPERATING RESISTANCE OF AN ELECTRICAL HARNESS CONNECTING AN ECU TO A SOLENOID CONTROLLED VALVE

(71) Applicant: DELPHI TECHNOLOGIES IP LIMITED, St. Michael (BB)

(72) Inventors: Patrick Daniel, Blois (FR); Pascal Bellamy, Chailles (FR)

(73) Assignee: DELPHI TECHNOLOGIES IP LIMITED

( * ) Notice: Subject to any disclaimer, the term of this patent is extended or adjusted under 35 U.S.C. 154(b) by 0 days.

(21) Appl. No.: 17/053,102

(22) PCT Filed: May 3, 2019

(86) PCT No.: PCT/EP2019/061381
§ 371 (c)(1),
(2) Date: Nov. 5, 2020

(87) PCT Pub. No.: WO2019/215034
PCT Pub. Date: Nov. 14, 2019

(65) Prior Publication Data
US 2021/0140383 A1 May 13, 2021

(30) Foreign Application Priority Data
May 8, 2018 (GB) ..................................... 1807459

(51) Int. Cl.
*F02D 41/20* (2006.01)
*B60R 16/02* (2006.01)
(Continued)

(52) U.S. Cl.
CPC .......... *F02D 41/20* (2013.01); *B60R 16/0207* (2013.01); *F02M 51/061* (2013.01);
(Continued)

(58) Field of Classification Search
CPC ................. B60R 16/0207; F02D 41/20; F02D 2041/2062; F02M 51/061; G01R 27/14; G01R 31/006; G01R 31/007
See application file for complete search history.

(56) References Cited

U.S. PATENT DOCUMENTS

| | | | |
|---|---|---|---|
| 4,689,551 A | 8/1987 | Ryan et al. | |
| 9,429,122 B2 * | 8/2016 | Akazaki | .................... G01L 9/00 |

(Continued)

FOREIGN PATENT DOCUMENTS

| | | |
|---|---|---|
| CN | 103954839 A | 7/2014 |
| DE | 4240497 A1 | 6/1994 |

(Continued)

*Primary Examiner* — Sizo B Vilakazi
*Assistant Examiner* — Mark L. Greene
(74) *Attorney, Agent, or Firm* — Joshua M. Haines

(57) ABSTRACT

A method of determining the electrical resistance of an actual harness connecting the Engine Control Unit (ECU) to a solenoid valve. The method includes providing a dummy harness connected at one end to the ECU and at the other end to a terminal connection in the vicinity of the solenoid valve. The method also includes determining the estimated RMS current through the actual harness and passing a current through the dummy harness such that the heat exchange to the environment is substantially the same as the actual harness. Power consumption of the dummy harness is measured and resistance of the actual harness is determined from estimated RMS and power consumption of the dummy harness.

10 Claims, 1 Drawing Sheet

(51) Int. Cl.
*G01R 27/14* (2006.01)
*G01R 31/00* (2006.01)
*F02M 51/06* (2006.01)

(52) U.S. Cl.
CPC .......... *G01R 27/14* (2013.01); *G01R 31/007* (2013.01); *F02D 2041/2062* (2013.01)

(56) References Cited

U.S. PATENT DOCUMENTS

| | | |
|---|---|---|
| 2009/0051365 A1 | 2/2009 | Bertness |
| 2010/0265051 A1 | 10/2010 | Sivertsen |
| 2017/0234917 A1 | 8/2017 | Weber et al. |

FOREIGN PATENT DOCUMENTS

| | | |
|---|---|---|
| EP | 2042716 A1 | 4/2009 |
| JP | 2001289897 A | 10/2001 |

\* cited by examiner

METHOD TO DETERMINE THE OPERATING RESISTANCE OF AN ELECTRICAL HARNESS CONNECTING AN ECU TO A SOLENOID CONTROLLED VALVE

CROSS REFERENCE TO RELATED APPLICATIONS

This application is a national stage application under 35 USC 371 of PCT Application No. PCT/EP2019/061381 having an international filing date of May 3, 2019, which is designated in the United States and which claimed the benefit of GB Patent Application No. 1807459.1 filed on May 8, 2018, the entire disclosures of each are hereby incorporated by reference in their entirety.

TECHNICAL FIELD

This invention relates to solenoid or piezo operated valves used in automotive applications. It has particular but not exclusive application to fuel injectors and inlet metering valves which are solenoid controlled.

BACKGROUND OF THE INVENTION

Automotive flow-control binary valves, such as fuel injector valves or digital inlet metering valves, are typically operated (actuated) using solenoid i.e. solenoid actuators. The timing of valve opening or closing events is critical in their operation and timing is the key performance and/or control parameter.

Typically the solenoid valve circuitry is connected to an ECU via wiring i.e. a harness. The solenoid circuitry may be regarded as an RL circuit (comprising resistance $R_S$ and inductance $L_S$) the response time of the RL circuit time it constitutes together with the electrical harness (having resistance $R_H$) it is power-supplied by, is dependent upon the resistance of the harness).

Thus the time response or time constant $\tau_{Vbatt}$ is a function of $R_S$ and $R_H$, or in other words $R_S$ and $R_H$ are a function of:

$$R_S + R_H = f(\tau_{Vbatt})$$

where $R_S$ and $R_H$, are the resistances of the solenoid and harness, respectively.

Thermal protection of the coil requires an accurate estimation of its resistance. This is at present achieved by estimating the overall harness and coil resistance via measurement of the RL circuit rising time, and considering the low impact of the harness resistance change with temperature, of which model-based estimation accuracy is therefore not stringent.

However with higher RMS control currents required by higher control pulse frequency (injection pattern, high speed pump flow control), this has led to the development of coil circuits having lower resistance in order to minimize heat released by the Joule effect. This consequently reduces the electrical resistance contrast between the coil and the harness; hence, the harness resistance estimation inaccuracy becomes too significant for the coil resistance estimation accuracy.

Both the current RMS through the harness, and the ambient temperature distribution, vary considerably; so that heat exchange cannot be modeled.

It is an object of the invention to overcome this problem. It is a further object of the invention to determine the resistance of the harness, when exposed to highly variable ambient temperature (in the engine bay, under the hood), and carrying variable pulsed current.

SUMMARY OF THE INVENTION

In one aspect is provided, in an engine system, a method of determining the electrical resistance of an actual harness $R_H(\theta_H)$, connecting the Engine Control Unit (ECU) to one or more a solenoid operated valves comprising:
a) providing a dummy harness connected at one end to the ECU and at the other end to a terminal connection in the vicinity of the solenoid valve;
b) determining the estimated RMS current ($I_S$) through the actual harness;
c) passing a current through the dummy harness ($I_D$) such that the heat exchange to the environment is substantially the same as that in the actual harness;
d) measuring the power consumption in the dummy harness;
e) from the results from b) and d) determining the resistance of the actual harness.

In step c) the current through the dummy harness ($I_D$) may be determined from according to the following equation:

$$I_D = \sqrt{\frac{R_{ref_H}}{R_{ref_{DH}}}} \cdot I_S$$

where $I_S$ is the estimated RMS current through the actual harness; $R_{ref_H}$ and $R_{ref_{DH}}$ are known resistances of the actual and dummy harnesses respectively at a reference temperature.

In step b) the value estimated RMS current (Is) through the actual harness may be determined from the current activation profile for the solenoid controlled valve.

The resistance of the harness at the ambient temperature, $R_H(\theta_H)$, in step d) may be determined form the following equation $$R_H(\theta_H) = \frac{Q}{I_S^2}$$

where Q is the power consumption estimated or determined at step d).

Said solenoid operated valve may be a fuel injector valve or an inlet metering valve.

The dummy harness comprises a lead or wire which may be substantially the same thickness as that of the actual harness.

BRIEF DESCRIPTION OF THE DRAWINGS

The present invention is now described by way of example with reference to the accompanying drawings in which.

DESCRIPTION OF THE PREFERRED EMBODIMENTS

In one aspect of the invention, for a solenoid controlled valve in an engine system, a dummy harness is provided in addition to the actual harness, and in one method, current is passed throught the dummy harness in controlled fashion to mimic the same heat loss (via the Joule effect) as occurs in the actual harness as well as under the same ambient conditions of temperature; this provides parameters enabling the actual harness resistance at that point in time to be determined. The dummy harness may generally have the same path/connections as the actual solenoid harness, e.g. from the ECU to the solenoid/solenoid circuitry or general location thereof, of the solenoid operated valve.

Apparatus

Figure 1:
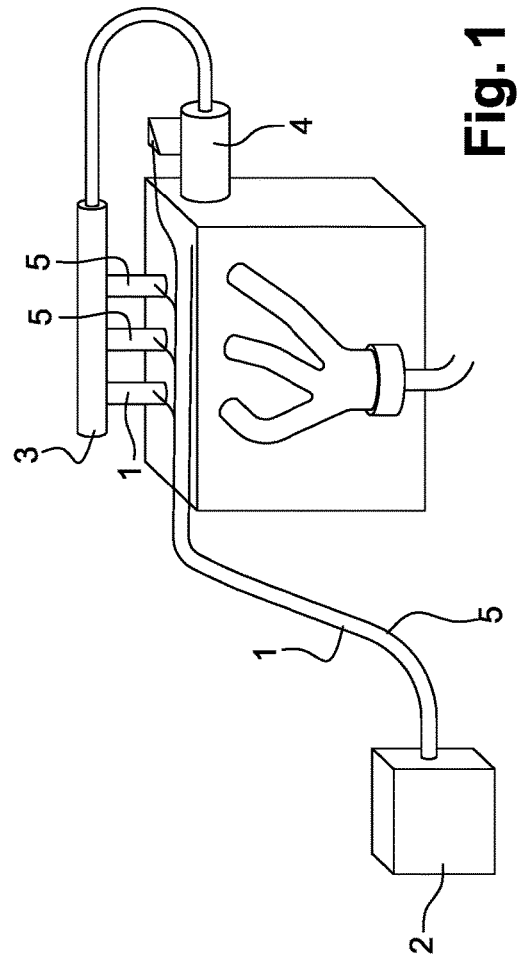
FIG. 1 shows a schematic figure of how a dummy harness is provided in an engine system.

FIG. 1 shows a schematic figure of how a dummy harness is provided in an engine system. Here an actual harness 1 is connected between an ECU 2 and one or more solenoid controlled fuel injection valves 3. The harness may alternatively or additionally connect to one or more solenoid controlled valves in the fuel supply system such as inlet valves of a high pressure fuel pump 4.

These valves are controlled and powered by signals and current from the ECU (via or from e.g. relevant power supply) along the actual harness, In addition a dummy harness 5 is provided which generally follows the same physical path as the actual harness, and may be connected to ground in the same general region as the end terminal of the actual harness; i.e. solenoid controlled valves. The dummy harness thus may comprise a lead or wire connected between the same general components are the real harness.

General Methodology

In an example of the methodology the dummy harness is provided with current such that it has preferably the same Joule (power/heat) release/loss as the real harness. In this way the heat loss (via the Joule effect) of the dummy harness is matched with that of the real harness; essentially thereby providing a physical model of the real harness. So any heat dissipation due to current flowing through the dummy harness is such that has the same heat exchange with the environment as the actual harness.

So $Q_H = Q_{DH}$ where $Q_H$ and $Q_{DH}$ are the heat exchange by the harness and dummy harness respectively, with their environment. This is achieved as will be explained hereinafter. The value of the heat exchange with the environment of the dummy harness is determined. The value of the RMS current flowing through the actual harness is computed and the resistance of the actual harness is computed from these two parameters.

Background

The heat loss (heat exchange) to the environment through a wire is generally $I^2R$ where I is the current flow and R is the wire resistance. So the heat dissipation due to current flowing through the dummy harness is such that has the same heat exchange with the environment occurs as in the actual harness, such that equation below is true:

$$I_{DH}^2 R_{DH} = I_H^2 R_H$$

where $I_{DH}$ and $I_H$ are the currents flowing through the dummy harness and real harness respectively and $R_{DH}$ and $R_H$ are the resistances of the dummy harness and real harness respectively.

So for the same heat exchange:

$$I_D = \sqrt{\frac{R_H}{R_{DH}}} \cdot I_S$$

At a particular reference temperature for identical heat exchange. The following equation holds where RrefH and RrefDH are the resistances of the harness and dummy harness at a reference temperature respectively. This reference temperature may be e.g. 20 degrees.

$$I_D = \sqrt{\frac{R_{ref_H}}{R_{ref_{DH}}}} \cdot I_S$$

The reference resistances may be measured "in factory" i.e. in standard steady conditions: they are the harness and dummy harness resistance at the reference temperature, resp. $Rref_H$ and $Rref_{DH}$ values. These are known or stored e.g. on the ECU already.

It is to be noted that the actual resistance of a resistor R such as a dummy harness at temperature θ is R(θ)=Rref*(1+α(θ−vref)), where θref is the reference temperature, will vary depending on the heat produced by the current vs the heat exchanged between the harness and its surrounding.

So in the following nomenclature $I_D$ and $I_S$ the current in the dummy and actual harness, respectively, $Rref_H$ and Rref are ODH their reference (e.g. at 20° C.) resistances.

Generally for there to be the same heat exchange, at any ambient temperature, the dummy harness RMS current will be the harness RMS current, scaled by the factor $$\sqrt{\frac{R_{ref_H}}{R_{ref_{DH}}}};$$

Example Method

Step 1

$I_s$ (=$I_{RMS}$) which is is the RMS value of the signal that drives the solenoid which the harness supplies, is determined.

There are various ways this could be implemented and the skilled person would be aware how this parameter could be determined.

This may be is computed by the control pulse/current profile of the signal sent to the solenoid actuator of the respective valve.

Figure 2:
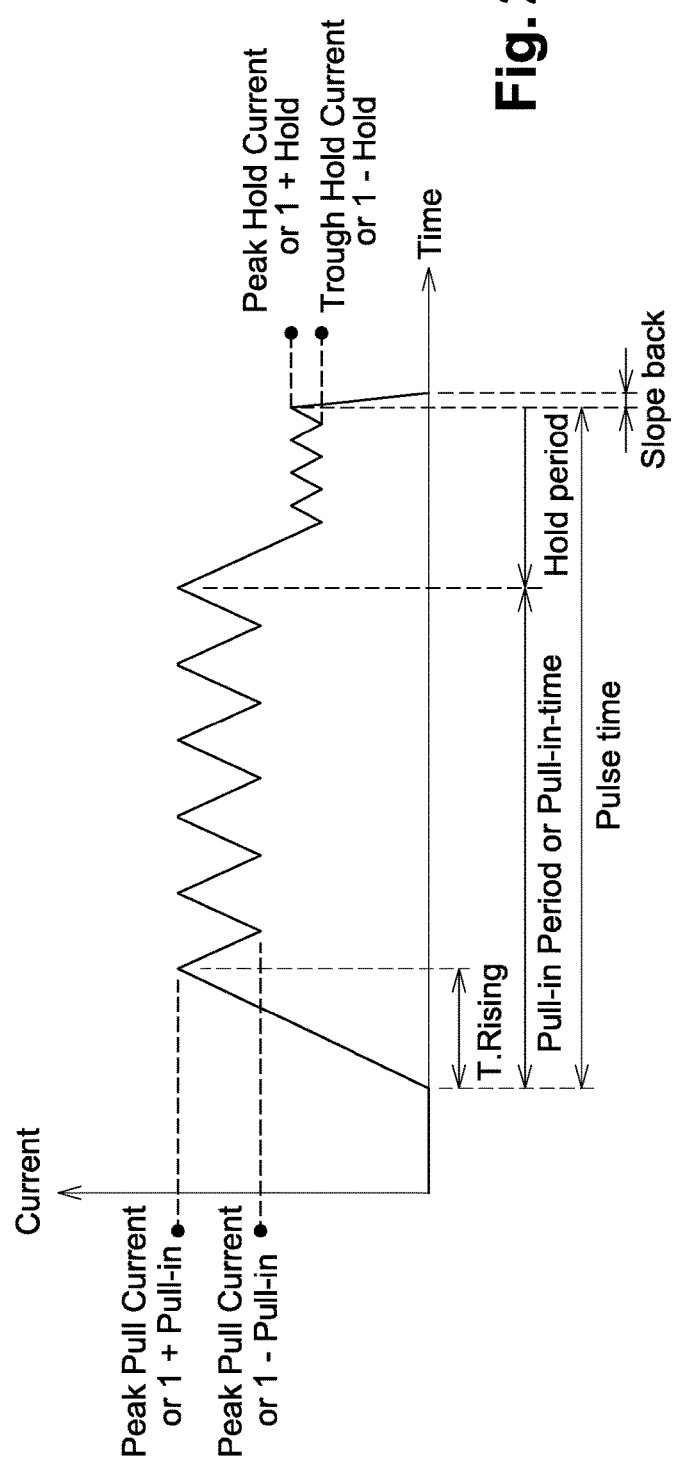
FIG. 2 shows a typical current profile used to actuate solenoid controlled fuel injectors.

FIG. 2 shows a typical current profile used to actuate solenoid controlled fuel injectors. The value of Is (=IRMS) may be determined form the following equation $$I_{RMS} = (I_{hold} \cdot \sqrt{T_{pull} + T_{hold}} + ((I_{pull} - I_{hold}) \cdot \sqrt{T_{pull}} + C_{ramp}) \cdot \sqrt{f}$$

wher—$I_{hold}$ and $I_{pull}$ are defined by the ECU hardware $T_{pull}$ and $T_{hold}$ depend on ECU software calibration, the frequency f depends on the engine rev speed.

Step 2

This dummy harness (connected to the ECU) it is controlled to supply it with current (e.g.by PWM on supply voltage or by a current mirror) such that it is supplied with current value intensity producing the same Joule dissipation in the dummy harness as the actual harness. This may be implemented using equation (3) e.g. by $$I_D = \sqrt{\frac{R_{ref_H}}{R_{ref_{DH}}}} \cdot I_S$$

where $R_{ref_H}$ and $R_{ref_{DH}}$ are known e.g. stored values of the resistances at a reference temperature of the harness and dummy harness respectively.

Step 3

The dummy harness power consumption Q is measured live to be used to identify the actual harness heat exchange. The skilled person would readily be aware of ways this could be done.

Step 4

The actual (real time) resistance of the harness at the ambient temperature, $R_H(\theta_H)$, is computed. This can be done from the power consumption of the dummy harness and the RMS current through the real harness; e.g. from the following equation:

$$R_H(\theta_H) = \frac{Q}{I_S^2}$$

In particular, the dummy harness could rely on much higher resistance, i.e. smaller diameter wires, in order to reduce both the harness cost and the drained current.

The invention claimed is:

1. A method of determining an electrical resistance of an actual harness, in an engine system, said actual harness connecting an Engine Control Unit (ECU) to a solenoid operated valve, said method comprising:
   a) providing, in addition to the actual harness, a dummy harness connected at one end to the ECU and at another end to a terminal connection in the vicinity of the solenoid operated valve;
   b) determining an estimated RMS current through the actual harness;
   c) passing a current through the dummy harness such that heat exchange to the environment is substantially the same as that in the actual harness;
   d) measuring power consumption in the dummy harness;
   e) determining a resistance of the actual harness from the results from steps b) and d).

2. The method as claimed in claim 1, wherein in step c) the current through the dummy harness is determined according to the following equation:

$$I_D = \sqrt{\frac{R_{ref_H}}{R_{ref_{DH}}}} \cdot I_S$$

where $I_S$ is the estimated RMS current through the actual harness; $R_{ref_H}$ and $R_{ref_{DH}}$ are known resistances of the actual harness and the dummy harness respectively at a reference temperature.

3. The method as claimed in claim 2, wherein in step b) the estimated RMS current through the actual harness is determined from a current activation profile for the solenoid operated valve.

4. The method as claimed in claim 3, wherein the resistance of the actual harness in step e) is determined from the following equation:

$$R_H(\theta_H) = \frac{Q}{I_S^2}$$

where Q is the power consumption measured at step d).

5. The method as claimed in claim 4, wherein said solenoid operated valve is a fuel injector valve or an inlet metering valve.

6. The method as claimed in claim 5, wherein the dummy harness comprises a lead or wire which is substantially the same thickness as that of the actual harness.

7. The method as claimed in claim 1, wherein in step b) the estimated RMS current through the actual harness is determined from a current activation profile for the solenoid operated valve.

8. The method as claimed in claim 1, wherein the resistance of the actual harness in step e) is determined from the following equation:

$$R_H(\theta_H) = \frac{Q}{I_S^2}$$

where Q is the power consumption measured at step d).

9. The method as claimed in claim 1, wherein said solenoid operated valve is a fuel injector valve or an inlet metering valve.

10. The method as claimed in claim 1, wherein the dummy harness comprises a lead or wire which is substantially the same thickness as that of the actual harness.

* * * * *